United States Patent [19]

Zappe

[11] 3,863,078

[45] Jan. 28, 1975

[54] JOSEPHSON DEVICE PARAMETRONS

[75] Inventor: Hans H. Zappe, Granite Springs, N.Y.

[73] Assignee: International Business Machines Corporation, Armonk, N.Y.

[22] Filed: Mar. 14, 1973

[21] Appl. No.: 341,002

Related U.S. Application Data

[63] Continuation of Ser. No. 267,840, June 30, 1972, abandoned.

[52] U.S. Cl. ........ 307/88 P, 307/88 LC, 340/173.1, 307/306, 307/245, 331/107 S, 330/4.9, 307/88.3

[51] Int. Cl. ........ H03k 17/56

[58] Field of Search ........ 340/173.1; 307/306, 88 P, 307/245, 88.3, 88 LC; 331/107 S; 330/49

[56] References Cited

UNITED STATES PATENTS

| | | | |
|---|---|---|---|
| 3,573,661 | 4/1971 | McCumber | 307/88.3 |
| 3,643,237 | 2/1972 | Anacker | 340/173.1 |
| 3,696,287 | 10/1972 | Silver et al. | 307/306 |
| 3,697,826 | 10/1972 | Mitani | 307/306 |
| 3,706,064 | 12/1972 | Dynes et al. | 307/245 |
| 3,723,755 | 3/1973 | Morse | 307/306 |
| 3,725,819 | 4/1973 | Fulton | 340/173.1 |
| 3,733,526 | 5/1973 | Anacker et al. | 331/107 S |

OTHER PUBLICATIONS

Applied Physics Letters, H. Zimmer, 10, 193, April 1, 1967.

Applied Physics Letters, Kanter et al., Vol. 19, No. 12, p. 515, December, 1971.

*Primary Examiner*—Stanley M. Urynowicz, Jr.
*Attorney, Agent, or Firm*—Jackson E. Stanland; Thomas J. Kilgannon, Jr.

[57] ABSTRACT

Josephson tunneling devices are used as parametrons in circuits for logic and memory. Parametron circuits are used as input devices to conventional pulsed Josephson tunneling device circuitry, and as output devices from pulsed Josephson tunneling device circuitry. Therefore, transfers from phase information to pulse information and from pulse information to phase information are obtained. Interconnection between superconducting circuit chips is achieved using Josephson tunneling parametrons and Josephson tunneling detectors. Another interconnection scheme uses capacitive coupling between superconducting circuit chips without physical interconnections therebetween, and employs Josephson tunneling devices on separate chips for the receiving and sending circuitry.

41 Claims, 15 Drawing Figures

JOSEPHSON DEVICE PARAMETRONS

This is a continuation of application Ser. No. 267,840, filed June 30, 1972, now abandoned.

BACKGROUND OF THE INVENTION

1. Field of the Invention

This invention relates to Josephson device parametrons, and more particularly to these parametrons and their use in various circuit configurations.

2. Description of the Prior Art

Josephson tunneling devices are known in the art and have been used previously in memory type circuitry. For instance, U.S. Pat. No. 3,625,583 describes a memory and storage system using superconducting Josephson tunneling devices for current steering in a plurality of memory cells In addition, detection of the currents in each memory cell is achieved through the use of additional Josephson tunneling devices whose voltage state is determined by the currents in the associated memory cells.

The prior art circuits employing Josephson tunneling devices used these devices in pulse-type modes of operation. That is, information was represented by the presence and absence of voltage or current signals, or by the direction of currents in the circuit. The prior art has not addressed the use of Josephson tunneling devices in other types of operation which may be advantageous.

The prior art has also not addressed the problem of interconnections between circuit logic chips having circuits thereon for memory and logic functions. Such functions could be performed by Josephson tunneling devices or by other electrical components. In general, the particular electronic components used are made as small as possible. This leads to a problem in providing interconnecting wires between modules located on the same circuit chip and between different circuit chips.

In the present invention, a new type of operation for Josephson tunneling devices is presented. An isolated Josephson tunneling device (i.e., one which is not provided with voltage or current connections) functions as a parametron which can be excited into oscillation by an applied magnetic field. The isolated junction oscillates with either of two stable phases at a frequency $\omega$ simply by varying the magnetic field (pump) at a frequency $2\omega$. The phase into which the device locks itself is determined by a small injec ed control signal having the desired phase. In another arrangement, pump frequencies different than $2\omega$ are used in a Josephson tunneling parametron comprised of connected parallel junctions.

Parametric circuits using Josephson tunneling devices have been proposed previously. However, these circuits used the Josephson tunneling device as a component in a conventional circuit (i.e., one using standard components and bias source). No where is it shown that an isolated Josephson tunneling device can itself function as a parametron. Examples of the prior art concerning parametric amplification using Josephson tunneling devices are the following:

H. Zimmer, APPLIED PHYSICS LETTERS, 10, 193, 1 April 1967;

Kanter et al., APPLIED PHYSICS LETTERS, Vol 19, No. 12, Page 515, December 1971.

Classical parametrons have limited gain since the resonant frequency $\omega$ can only be varied by small amounts. In contrast with this, the isolated Josephson tunneling device parametrons of the present invention may achieve gains of 5,000–10,000 in only 10 oscillations, since the clamps in frequency $\omega$ in a Josephson junction is very large for even moderate changes of pump magnetic field. Further, whereas classical parametrons did not perform at very high frequencies, ($10^{11}$ $-^{10^{12}}$ Hz), the present Josephson tunneling device parametrons will perform at these frequencies.

Accordingly, it is the primary object of this invention to provide a new type of parametron which has high gain and performs at very high frequencies.

It is another object of this invention to provide improved circuitry for connecting modules and circuit chips using a minimum number of interconnections. It is still another object of this invention to provide a superconducting parametron which does not require current or voltage inputs for parametric operations.

It is a still further object of this invention to provide an improved means for communication between circuit chips using a minimum number of interconnections.

It is another object of this invention to provide parametric circuitry using Josephson tunneling device parametrons.

It is still another object of this invention to provide apparatus for transferring pulse-type information to information represented by the phase of an AC signal, and vice versa.

SUMMARY OF THE INVENTION

A Josephson tunneling device, having any structural geometry, can function as a parametron even though no external circuit connections are made to it. A magnetic pump field oscillating to cause the maximum Josephson current $I_m$ to oscillate at twice the resonant frequency of the Josephson tunneling device will cause parametric oscillations to build up in the Josephson device. Thus, a discrete Josephson tunneling device by itself will function as a parametron and can be used in any type of parametron circuitry to provide such functions as logic and memory.

In a variation, a quantum interference device comprising two connected Josephson tunneling devices is used as a parametron where the pump magnetic field has a frequency less than twice the resonant frequency of the quantum inteference device.

Josephson tunneling devices can be used as conventional pulse type circuitry (where information is represented by current or voltage levels) to provide an input to a Josephson tunneling device parametron in order to achieve phased outputs indicative of the pulse information provided to the parametron. In the reverse of this, information contained in the phase of input signals is changed to pulse outputs using Josephson junction detectors. Therefore, it is possible to use Josephson junction parametrons with conventional Josephson junction pulse circuitry in order to extend the utilization of these tunneling devices.

Josephson tunneling parametrons can be used to provide information transfer between one circuit chip and another in which only a single transmission line connects the two chips. Parametrons in each circuit chip carrying the information from numerous information channels can transmit this information over the interconnecting transmission line in an efficient manner using no net dc component for information transmission.

Another chip-to-chip interconnection scheme uses Josephson oscillators coupled to Josephson tunneling device detectors located on the other superconducting chip. Still another interconnection scheme uses capacitive coupling between receiving and sending circuits located on different circuit chips, there being no interconnecting transmission line required. Again, Josephson tunneling device parametrons and detector devices are used in the receiving and sending circuitry in the circuit chips.

These and other objects, features, and advantages will be apparent in the following more particular description of the preferred embodiments.

DETAILED DESCRIPTION OF THE PREFERRED EMBODIMENTS

Figure 1:
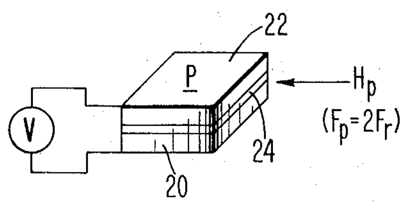
FIG. 1 shows an isolated Josephson tunneling device which functions as a parametron under the influence of the pump magnetic field $H_p$.
Figure 2:
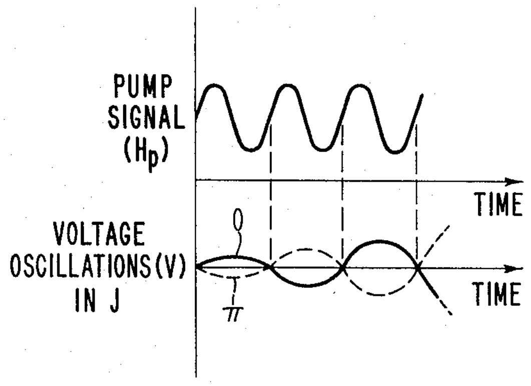
FIG. 2 shows the pump signal $H_p$ and the voltage oscillation V developed in the parametron of FIG. 1, measured against time.

FIGS. 1 and 2

FIG. 1 shows an isolated Josephson tunneling device which functions as a parametron. The Josephson device is itself a resonant circuit in which oscillations can be built up at a frequency $F_r$ by applying a pump signal such that $I_m$ varies at a frequency $2F_r$. In this case, the pump signal is a magnetic field $H_p$ which intercepts the Josephson tunneling parametron, indicated by the legend P. The oscillations built up in parametron P are voltage and current fluctuations in the parametron itself.

Structurally, Josephson tunneling device P is comprised of a base electrode 20, a counter electrode 22, and a tunnel barrier 24 located between these electrodes. Electrodes 20 and 22 are comprised of superconducting materials, such as lead, while tunnel barrier 24 is generally an oxide of the base electrode 20. For lead electrodes, the tunnel barrier 24 is generally a lead oxide. The physical characteristics of Josephson tunneling device P are well known and it is possible to use many different materials for the various parts of this device. Further, configurations other than the planar device shown in FIG. 1 are suitable in this invention.

FIG. 2 shows the pump signal $H_p$ as a function of time, as well as the voltage oscillations V which develop in parametron P when the pump signal is applied. It should be understood that both current and voltage oscillations develop in device P when the pump signal $H_p$ is applied.

As is apparent from FIG. 2, the voltage oscillations developed in device P have a frequency one-half that of pump signal $H_p$. The oscillations develop at a frequency which is the resonant frequency of parametron P. This frequency is determined by $I_m$, the phase difference of the superconducting order parameter, and capacitance C of the device P.

As is also apparent from FIG. 2, the oscillations in device P build up in amplitude with time. However, since the Josephson tunneling device is a non-linear device, the device will be self-limiting and the amplitude of the oscillations will level off to some fixed value.

The oscillations which develop in device P can have either of two stable phases. These oscillations are represented by the curves labelled 0 and $\pi$, respectively. Both are stable phases and can be used to represent informational states. For instance, the zero plane can be used to represent a binary 1, while the $\pi$ phase can be used to represent a binary 0.

FIG. 3

Figure 3:
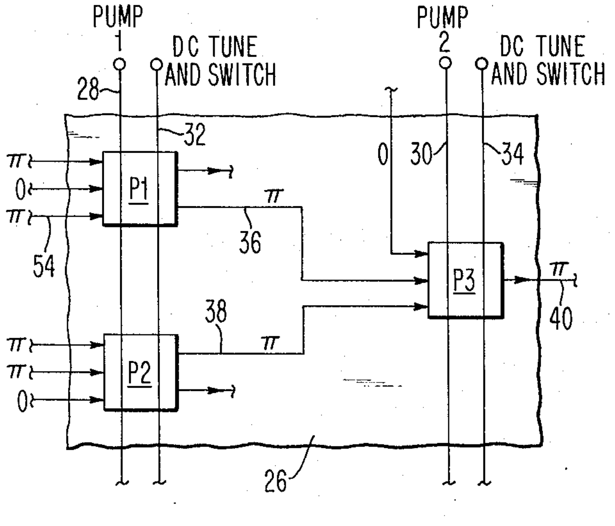
FIG. 3 shows schematically the circuit connections for a plurality of parametrons used to provide some circuit function.

FIG. 3 shows a schematic of electrical interconnections for the Josephson tunneling parametrons P1, P2, and P3. These parametrons are located on a ground plane 26 and can either be insulated from the ground plane or use the ground plane as one electrode of the parametron. The basic structure of parametrons P1, P2, and P3 is the same as that shown in FIG. 1.

Whereas only three parametrons are shown in this FIG., it should be understood that many parametrons can be utilized in a circuit to provide memory and logic functions. For instance, various logic decisional levels can be obtained with a plurality of parametrons in which information flow is from one decision level to the next. Such circuits are well known in the art and will not be described herein. It is only important to note that any type of known parametron circuit can employ Josephson tunneling parametrons of the type shown in FIG. 1.

Located over each parametron is a line which carries current to supply the pump magnetic field for the parametrons. For instance, conductor 28 provides current which produces pump field 1 for parametrons P1 and P2, while conductor 30 carries current which produces pump field 2 for parametron P3. Generally, there is a plurality of columns of parametrons variously interconnected so that each column has a pump line associated with it.

Figure 4:
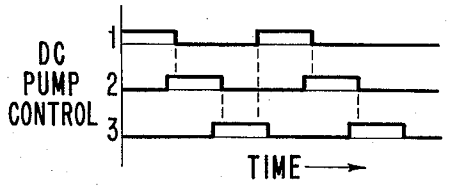
FIG. 4 shows the tank sequence of pump control pulses used in parametron circuitry, such as that of FIG. 3.

Associated with parametrons P1 and P2 is a conductor 32 which provides current used for tuning and switching parametrons P1 and P2. Correspondingly, conductor 34 is used to provide current which is used to tune and switch parametron P3. The use of dc tuning and switching eliminates the need for pulsing the pump signal, thereby providing more efficient operation. If the dc tuning and switching were not provided, the pump signals P1 and P2, as well as additional pump signal P3, would have to be applied in sequence as illustrated in FIG. 4. This eliminates cross-talk between columns of parametrons so that information flow is in a single direction (i.e., back-flow of informations is prevented).

A magnetic field intercepting a Josephson tunneling parametron will detune the parametron from its resonant frequency, since Josephson parametrons are very sensitive to magnetic fields intercepting them. The dc tuning field is a very accurate way of tuning the parametrons. Instead of turning the pump signals on and off, the pump signals can be on continuously while the individual parametrons are tuned by signals in conductors 32 and 34. These parametrons will also be switched on and off by the dc pulses used for tuning these parametrons.

In FIG. 3, the pump signal is used to change the maximum Josephson current in the parametron in order to build up oscillations in the parametron. The dc signal is used to tune the resonant frequency of the parametron to that of the input signal, represented by the arrows entering each parametron labelled with a phase, either 0 or $\pi$. For instance, parametron P1 has three inputs, $\pi$, 0 and $\pi$ (entering on line 54). The phase inputs $\pi$ and 0 will cancel each other so that the net input signal to device P1 has phase $\pi$. When the dc pulse is present in conductor 32 causing the resonant frequency of device P1 to be the same as that of the input signal $\pi$, parametron P1 will produce an output ac signal on line 36 which also has the phase $\pi$. Correspondingly, the output of parametron P2 will be a signal having a phase $\pi$ appearing on conductor 38.

The outputs of parametrons P1 and P2 then are applied to parametron P3. This parametron will not produce an output until a dc tuning and switching pulse is applied on conductor 34. With the inputs (0, $\pi$, $\pi$) applied to P3, an output having phase $\pi$ will appear on line 40 when the dc pulse is present in conductor 34.

Although only two logic levels of decision are shown in the circuit of FIG. 3, it should be understood by those of skill in the art that any number of parametrons can be coupled together to provide many circuit functions. FIG. 3 simply illustrates that a parametron of the type shown in FIG. 1 can be used in any of these known parametric circuits.

FIG. 4

As was mentioned previously, the use of the dc tuning and switching pulse means that the pump signals can be on continuously. However, if the dc tuning and switching pulses were not used, then it would be necessary to sequence the onset of the pump pulse signals (ac signals) in order to prevent cross talk between parametrons in different decision levels. In FIG. 4, the sequence of the dc control pulses (dc tune and switch) necessary to prevent back flow of information is shown.

It should be noted that control pulse P2 overlaps slightly with control pulse P1, while control pulse P3 overlaps slightly with the tailing end of control pulse P2. Thus, communication between parametrons in successive decision levels is obtained, while communication in a direction reverse to the direction of information flow is not possible. For instance, pulse P3 does not overlap with previously occurring pulse P1.

FIG. 5

This figure shows the physical interconnection for the parametrons used in circuits such as that of FIG. 3. In this case, each parametron P1, P2, P3 . . . uses the superconducting ground plane 26 as its base electrode. The tunnel barrier 42 for parametron P1 is generally an insulator as is the tunnel barrier 44 of parametron P3. The counter electrode 46 of device P1 and the counter electrode 48 of device P3 are comprised of superconducting materials. Pump lines 28 and 30 are insulated from devices P1 and P3 respectively by the layer 50 of insulation. Correspondingly, conductors 32 and 34 for dc tuning and switching are also insulated from devices P1 and P3, respectively, by insulation 50.

Insulating layer 52 is used to separate devices P1 and P3. Conductor 36 which joins devices P1 and P3 is connected to counter electrodes 46 and 48 of these devices. Conductor 54 provides a phase input to parametron P1 from some other parametron which is not shown in FIG. 3.

Figure 5:
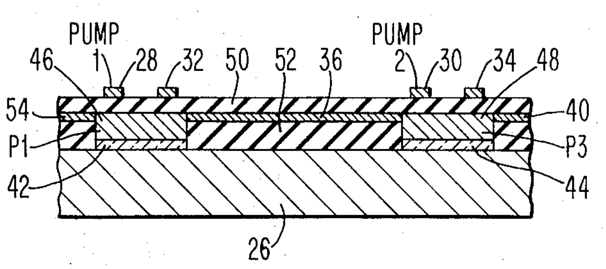
FIG. 5 shows the structural interconnections and metallurgy for a portion of the circuit of FIG. 3, illustrating the fabrication steps used to provide Josephson parametron circuitry.

Thus, it is readily apparent that a large circuit can be fabricated using conventional planar technology to provide circuits having high density. The individual fabrication steps that are used are those conventionally known in the art, and include evaporation, sputtering, an photoetching. Such processes are well known and will not be described here, as it is obvious to one of skill in the art how to make the physical structure illustrated in FIG. 5.

FIG. 6

This figure shows a parametron P which is a superconducting quantum interference device (SQUID). It is used to provide a parametron in which the frequency of the pump signal need not be twice the resonant frequency of parametron P.

In more detail, parametron P is comprised of two Josephson tunneling devices J1 and J2, which are connected together by superconducting line 56 and ground plane 58. Thus, the SQUID is provided by a superconducting loop having two Josephson tunneling junctions therein. In this case, the tunnel barrier for junction J1 is labelled 60 while that for tunnel device J2 is labelled 62. Again, barriers 60 and 62 are the same as those conventionally known and which usually comprise an oxide of the superconducting ground plane 58.

Located adjacent the parametron P, and insulated therefrom, are current carrying lines 64 and 66. Conductor 64 carries current used for dc tuning and switching while conductor 66 carries currents used for providing pump magnetic field $H_P$ which intercepts parametron P and causes it to oscillate. The parametron of FIG. 6 operates in the same manner as the previously described Josephson tunneling parametron. However, because a quantum interference device is used in which no flux can be trapped in the superconducting loop joining the tunnel junctions, the frequency of the pump magnetic field does not have to be twice the resonant frequency of the SQUID P. To achieve the quantum interference device, the inductance and maximum Josephson current $I_m$ in the device is chosen so that $LI_M < \phi_0$, where L is the inductance of device P, $I_m$ is the maximum Josephson current in the device P, and $\phi_0$ is a flux quantum equal to $2 \times 10^{-15}$ volt-sec.

FIG. 7

Figure 6:
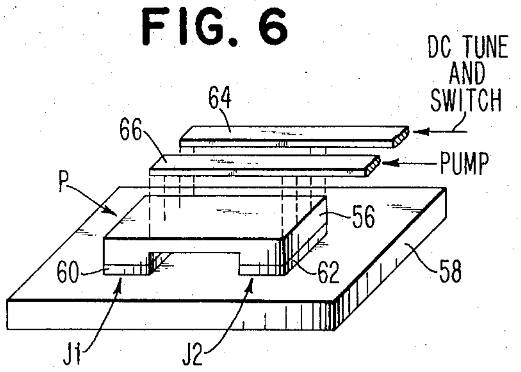
FIG. 6 shows a Josephson quantum interference device used as a parametron in which the pump signal has a frequency which is less than twice the frequency of resonance of the quantum interference device.

This figure presents a plot of the maximun Josephson current $I_m$ in the parametron of FIG. 6, measured against the pump magnetic field $H_P$. From this plot it is evident that the current $I_m$ will undergo many oscillations for each oscillation of the pump field $H_P$. To operate the parametron of FIG. 6, the current $I_m$ should vary at twice the resonant frequency of the quantum interference device and the pump $H_P$ is adjusted to effect this.

Figure 7:
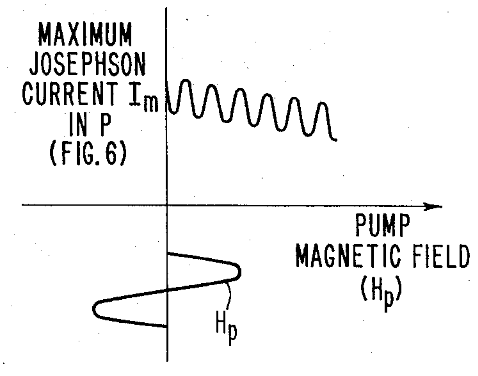
FIG. 7 is a plot of the maximum Josephson current $I_m$ in the parametron of FIG. 6, plotted against the pump magnetic field in the parametron.

In FIG. 7, it should be understood that the waveform of the pump $H_P$ can have shapes other than sinusoidal, for instance triangular.

FIG. 8

Figure 8:
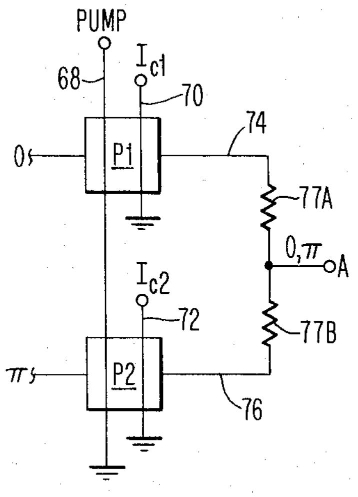
FIG. 8 is a Josephson parametron circuit which will convert pulse signals to phase signals representative of information, which can be then used in Josephson parametron circuitry.

In order to utilize Josephson parametron circuits together with pulsed Josephson circuits, it is necessary to have circuitry which will transform information represented by the presence and absence of pulses to information represented as the phase of an ac signal, and vice versa. FIG. 8 shows an embodiment for converting information in the form of pulses to information in the form of the phase of an ac signal.

In more detail, Josephson tunneling parametrons P1 and P2 have reference phase inputs 0 and $\pi$, respectively. These reference inputs are provided by other circuitry which is not shown in this drawing. A common conductor 68 provides the pump signal. A control line 70 carries current pulses $I_{c1}$ to tune device P1 while conductor 72 carries current pulses $I_{c2}$ for tuning device P2. The output of device P1 is provided on conductor 74 while the output of device P2 is provided on conductor 76. Resistors 77A and 77B provide isolation between the outputs of parametrons P1 and P2.

In operation, a 0 phase or $\pi$ phase ac signal is provided at terminal A in response to the pulse information $I_{c1}$ and $I_{c2}$ applied in conductors 70 and 72, respectively. For instance, if it is desired to provide a zero phase output a pulse of current $I_{c1}$ is applied to conductor 70. This tunes device P1 to make its resonant frequency one-half that of the pump frequency so that device P1 will oscillate. This means that a 0 phase signal will be provided on conductor 74. In the same manner, a current pulse in conductor 72 will tune device P2 causing a $\pi$ phase ac signal to appear at terminal A. The signals $I_{c1}$ and $I_{c2}$ are representative of pulse information, and can conveniently be representative of binary 0 and 1 bits.

FIG. 9

This figure shows the circuitry required to transfer information in the form of phased ac signals to pulse type information where the presence and absence of a voltage level or current level is representative of information.

A Josephson tunneling device J1 which functions as a resonant circuit (not a parametron) is used as the ac detector. The ac information represented by the phase of the input signals is provided on input conductors 78 and 80. Connected to the electrodes of tunnel device J1 is a superconducting transmission line 82 terminated in an impedance $Z_0$, which is generally the characteristic impedance of transmission line 82. A current source 84 provides Josephson tunneling current $I_J$ to device J1. Current source 84 is triggered in operation by a control means 86.

The input conductors 78 and 80 are generally not dc coupled to an electrode of device J1. In order to prevent dc current from flowing back into the circuitry connected to conductors 78 an 80, these conductors are either capacitively coupled or inductively coupled to device J1. This type of coupling will be illustrated in more detail in FIGS. 10 and 11.

Figure 9:
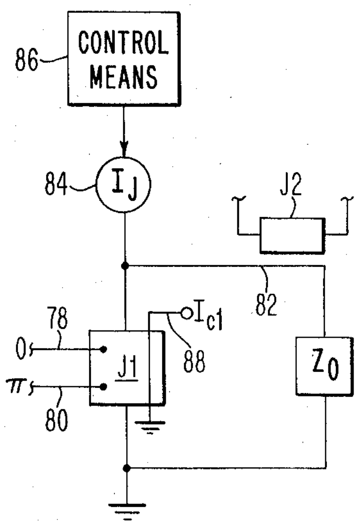
FIG. 9 shows a Josephson tunneling device circuit in which input signals bearing information in their phase content are converted to pulse signals for use in conventional Josephson tunneling device circuitry.

The circuit of FIG. 9 operates to transfer information from a phase representation to a pulse representation by switching tunnel device J1 between its zero voltage state (superconducting state) and its non-zero voltage state (resistive state). When device J1 is switched to its resistive state, current pulses will be produced in transmission line 82 which, in turn, will establish magnetic fields coupling to another Josephson device J2. Thus, a pulse output on line 82 can be used to control other Josephson devices as is done in conventional pulse type Josephson circuitry.

If the combination of the inputs on conductors 78 and 80 have opposite phase so that they cancel one another, no input signal will be provided to device J1. Current $I_J$ through J1 is normally not sufficient to switch device J1 to its resistive state ($V \neq 0$). Only when an input signal is received by J1 will it switch to a resistive state. That is, the threshold for switching J1 is $I_m$ if the net input signal is zero, but is $I'_m < I_m$ if the net input signal is not zero. When the input signals are in phase, J1 will start to oscillate, so that $I_m$ will decrease to a value $I'_m < I_J$. This will switch J1 to its resistive state. The current pulse $I_{c1}$ provided in control conductor 88 is used to tune the resonant frequency of device J1 to that of the input signals on conductors 78 and 80.

Consequently, device J1 will resonate if the phase of the ac signals on conductors 78 and 80 is the same. In that case, device J1 will be switched to its resistive state causing a current pulse to appear in transmission line 82. Therefore, ac phase information will be transferred to pulse type information.

Figure 10:
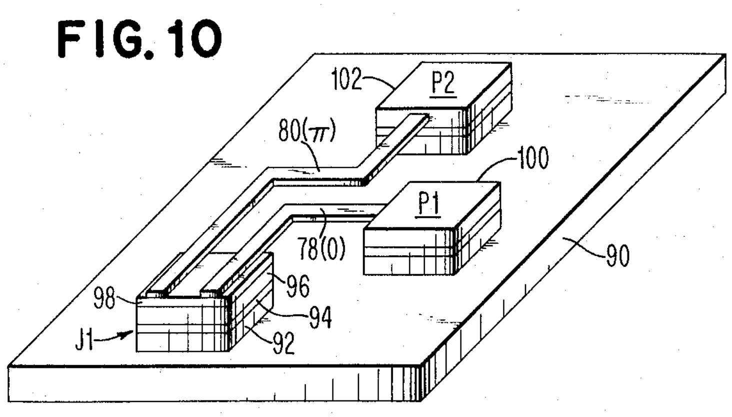
FIG. 10 shows capacitive coupling of Josephson parametrons to a Josephson tunneling device used for conversion of phase information to pulse information.
Figure 11:
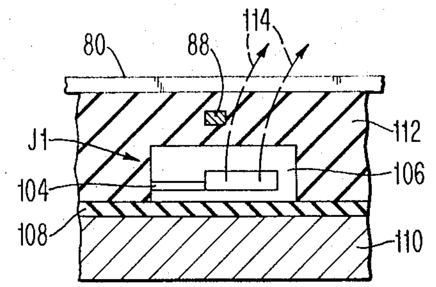
FIG. 11 shows inductive coupling of a Josephson tunneling device to a strip line.

FIGS. 10 and 11

These figures show capacitive coupling and inductive coupling, respectively, to tunnel device J1 of FIG. 9. As stated previously, this type of coupling will eliminate leakage current paths for dc current $I_J$ into the parametron circuitry connected to the phase-pulse transfer circuit of FIG. 9.

In more detail, a substrate 90 has Josephson tunneling device J1 thereon. Tunnel device J1 is comprised of base electrode 92, tunnel barrier 94, and counter electrode 96. Located over counter electrode 96 is a layer of insulation 98, which conveniently could be SiO. This insulation separates the input metallic conductors 78 an 80 from electrode 96. In this manner, conductors 78 an 80 are capacitively coupled to electrode 96 by insulating layer 98.

In FIG. 10, parametrons P1 and P2 are shown. The conductor 78 supplying zero phase information to device J1 is an output conductor from parametron P1 while conductor 80 is an output conductor from parametron P2. The structure of parametrons P1 and P2 is the same as that illustrated in FIG. 1. In this drawing, conductor 78 is electrically connected to counter electrode 100 of parametron P1 while conductor 80 is electrically connected to counter electrode 102 of device P2. Thus, FIG. 10 shows the physical structure for capacitive coupling interconnections between parametrons and resonant Josephson tunneling devices. While the connection for the current source 84 is not shown, it is understood by one of skill in the art that this current source is connected to cause current flow between the electrodes 92 and 96 of Josephson tunneling device J1.

FIG. 11 shows an inductive coupling arrangement which can be used to couple signals between devices without a leakage path for dc currents. In more detail, the tunnel barrier 104 of Josephson device J1 is formed in a superconducting loop 106. Device J1 is located on insulating layer 108 which has been deposited on the ground plane 110. Located over device J1 and insulated therefrom by insulating layer 112 is the control conductor 88 (FIG. 9). Deposited directly on insulating layer 112 are the input lines 78 and 80 which are to be inductively coupled to device J1. In FIG. 11, only the line 80 is shown.

In operation, ac phase information in conductors 78 and 80 produces magnetic fields which couple to the loop comprising J1. These magnetic field lines are illustrated by the dashed arrows 114. That is, there is flux linkage with the strip lines which carry information from parametron devices to Josephson device J1.

Figure 12:
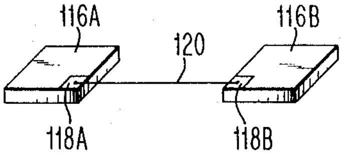
FIG. 12 shows a schematic arrangement of two circuit chips having circuitry thereon which is interconnected by a transmission line.

FIG. 12(chip-to-chip transfer)

FIG. 12 schematically shows two circuit chips 116A and 116B. These chips have receiving and sending circuits 118A and 118B located thereon, which are connected by a conductor 120. The rest of each chip 116A and 116B is comprised of superconductive circuitry using Josephson tunneling devices for performance of numerous functions including memory and logic.

Information communication between chips is a critical part of an overall system. Because individual superconductive devices are made very small, it is desired to minimize the number of interconnections required for transfer of information between superconductive chips. The use of Josephson devices as parametrons and as detectors of ac information provides very desirable chip interconnection schemes. These schemes will be explained in more detail with respect to FIGS. 13A, 13B, and 14.

FIG. 13A

This figure shows in more detail the sending and receiving circuits on each of the circuit chips between which information is to be conveyed. In this particular example, information is being communicated from chip 116A to chip 116B, although information transfer can be in both directions.

In particular, sending circuitry 118A and receiving circuitry 118B are comprised of Josephson tunneling parametrons. The input channels A, B . . . N on chip 116A provide pulse information to a set of parametrons associated with each of the information channels. For instance, parametrons P1*a* and P1*b* are associated with information channel A, while parametrons P2*a* and P2*b* are associated with information channel B. In the receiving circuitry 118B, parametron P1 receives information from information channel A of chip 116A, while parametron P2 receives information from channel B of chip 116A. To indicate this more clearly, the output terminals of the parametrons P1, P2, . . . PN in circuit 118B are given the same channel designations as the information channels on chip 116A with which they are associated.

In circuitry 118A, each parametron in the set associated with a channel has a control line for receipt of a binary bit of information from the information channel. For instance, control line 120 receives pulses representative of binary 0 bits while control line 122 receives pulses representative of binary 1 bits. Conductor 120 is a control line for parametron P1*a* while conductor 122 is a control line for parametron P1*b*. As is apparent from this drawing, each parametron in the set of parametrons associated with each information channel has a control line corresponding to one of the binary information bits in each information channel.

Each of the parametrons associated with an information channel receives a reference phase input. For instance, parametron P1*a* receives a 0 phase reference input on line 124 while parametron P1*b* receives a $\pi$ phase input on line 126. Additionally, each parametron in the circuit 118A receives a pump magnetic field established by currents in overlying pump lines. For instance, the parametrons P1*a*, P1*b* receive pump signals from currents along lines 128 and 130, respectively.

In operation, the reference phase inputs to the parametrons associated with each input channel are always present as is the pump signal to each of these parametrons. The presence and absence of control pulses in the control conductors associated with each of the parametrons will tune the parametrons so that they will oscillate and provide a phase output which is the same as their phase input. For instance, if a zero phase output is desired to be transmitted from information channel A, a control pulse on line 120 will tune parametron P1*a* to the frequency of the zero phase input on line 124. This will cause parametron P1*a* to oscillate and provide a zero phase output on output line 132. This zero phase output will then be transmitted on line 120 to the receiving circuitry 118B.

In the same manner, if it is desired to transmit a $\pi$ phase output from information channel A on chip 116A, a control signal appears on control line 122. This tunes parametron P1*b* so that it will oscillate and provide a $\pi$ phase output on its output line 134. The operation of the parametrons associated with other information channels is identical. That is, each of the channels will provide a zero phase or $\pi$ phase output in accordance with the binary information signals received on the control lines associated with the parametrons responsive to these information channels.

The receiving circuitry 118B on chip 116B is also comprised of parametrons each of which has a resonant frequency which is the same as one resonant frequency of the parametrons associated with the information channels of chip 116A. For instance, parametron P1 has a resonant frequency $F_1$, which is identical to the resonant frequency $F_1$ of parametron P1*a* and P1*b* associated with information channel A.

The parametrons in circuitry 118B receive pump signals along overlying current lines. For instance, P1 receives a pump current along line 136. Further, each parametron has associated therewith a control conductor for tuning the parametron and causing it to oscillate. For instance, control conductor 138 is associated with parametron P1, control conductor 140 is associated with parametron P2, while control conductor 142 is associated with parametron PN. These control conductors carry current pulses $I_{c1}, I_{c2}, \ldots, I_{cN}$.

In operation, the receiving parametrons are tuned by signals in the appropriate control lines 138, 140, . . . , 142 in order to be responsive to phase information having the frequencies $F_1, F_2, \ldots, F_N$.

In more detail, if it is desired to detect information being transmitted from information channel A of chip 116A, a current pulse $I_{c1}$ appears in control conductor 138. This tunes parametron P1 and causes it to oscillate at a frequency $F_1$. This means that parametron P1 will receive phase information from information channel A and will provide an output on terminal A representative of that information. Depending upon the control signals applied to parametrons P1*a* and P1*b*, the output of parametron P1 will be either a 0 phase or a $\pi$ phase signal.

The same detection operation occurs with parametrons P2 . . . PN. These receiving parametrons are tuned to the frequency of the associated information channel on chip 116A. Because the Josephson tunneling devices have such sharp resonant frequencies, they will be responsive only to signals having their resonant frequencies, and to none other. In this way, information will be transmitted and separated from one channel to the next. Further, information transfer between superconductive chips will be by an ac signal only.

FIG. 13B

This figure illustrates another circuit for transmitting information between superconductive chips over the line 120 (FIG. 12). In this embodiment, Josephson tunneling oscillators are used and Josephson tunneling devices provide the detection means for transmitted information.

In more detail, transmitting circuitry 118A is comprised of a plurality of superconducting oscillators each of which is associated with a different information channel located on chip 116A. For instance, oscillator 1 is associated with information channel A, while oscillator 2 is associated with information channel B. Information in each information channel is in the form of pulses, the presence of a pulse being a binary 1 and the absence of a pulse being a binary 0, for instance. These pulses are used to trigger the oscillators to provide an output having a frequency which is assigned to that particular channel. For instance, a pulse 144 is used to trigger oscillator 1 associated with information channel A. Upon receipt of pulse 144, oscillator 1 will resonate to provide an output signal having the frequency $F_1$.

Each of the oscillators in circuitry 118A is comprised of Josephson tunneling devices. The trigger pulses 144 are provided in control lines adjacent to these oscillators, which cause changes in the maximum Josephson current of the Josephson device in the oscillator. This in turn causes oscillation of the Josephson devices. The Josephson oscillators are conventionally known and are comprised of Josephson tunneling devices with load lines which intercept the current-voltage curves of the Josephson devices at a current level below the minimum current level required to switch the Josephson device back to its zero voltage state.

The receiving circuitry 118B is comprised of a plurality of Josephson tunneling devices having resonant frequencies which are the same as the resonant frequencies of the oscillators associated with the various information channels in chip 116A. For instance, Josephson device J1 has a frequency $F_1$ which is identical to the frequency of oscillator 1 associated with information channel A. A current source 146 provides current $I_J$ to each of the Josephson tunneling devices J1, J2, . . . , JN. This current is not sufficient to switch these tunnel devices J1, . . . , JN to their resistive state. Current source 146 is triggered to provide current pulses $I_J$ by input signals received from control means 148.

Each of the Josephson devices J1, . . . , JN has connected thereto a transmission line 150, 152, . . . , 154, respectively. These transmission lines are terminated in impedances Z1, Z2, . . . , ZN.

Each Josephson device J1, J2, . . . , JN is also provided with a control line 156, 158, . . . , 160, respectively. Control currents $I_{c1}, I_{c2}, \ldots, I_{cN}$ flow through these control lines to tune the resonant frequency of the associated Josephson device.

Circuitry 118B is essentially the same as the circuitry shown in FIG. 9. For instance, to communicate information from channel A of chip 116A to chip 116B, oscillator 1 in circuit 118A is caused to oscillate, thereby providing a signal at frequency $F_1$ on conductor 120. This signal is detected by Josephson tunneling device J1 when a current pulse $I_{c1}$ is applied on conductor 156. Current pulse $I_{c1}$ tunes device J1 to frequency $F_1$, which causes device J1 to switch to the resistive state. This in turn provides a current pulse on transmission line 150. As was described with respect to FIG. 9, the current pulse on transmission line 150 can be used to control other Josephson devices located in the logic and memory circuits on chip 116B.

In the operation described in the previous paragraph, Josephson devices J2, . . . , JN are detuned and not responsive to frequency $F_1$. Therefore, the information at frequency $F_1$ will be transmitted only to the appropriate receiving circuitry associated with channel A.

FIG. 14

Figure 13A:
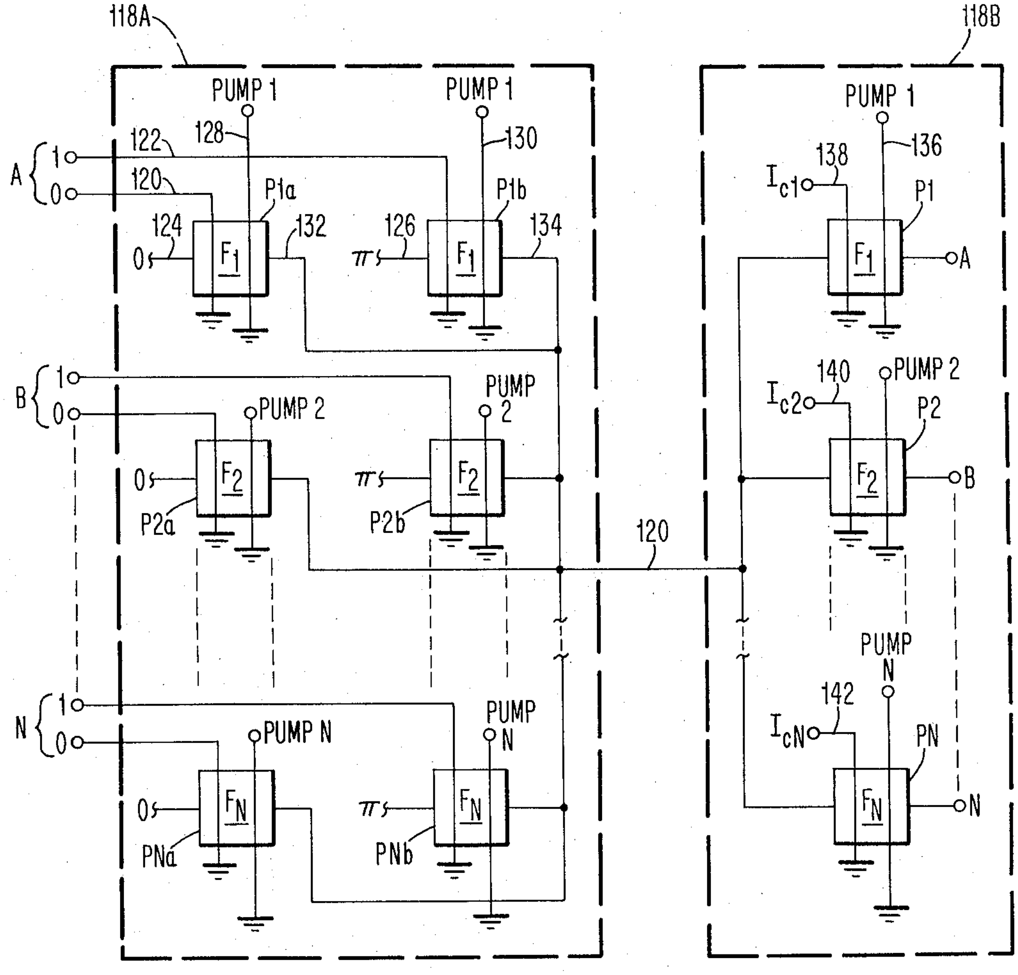
FIG. 13A is a schematic illustration of Josephson parametron circuitry used to provide information transfer between the circuit chips of FIG. 12.
Figure 13B:
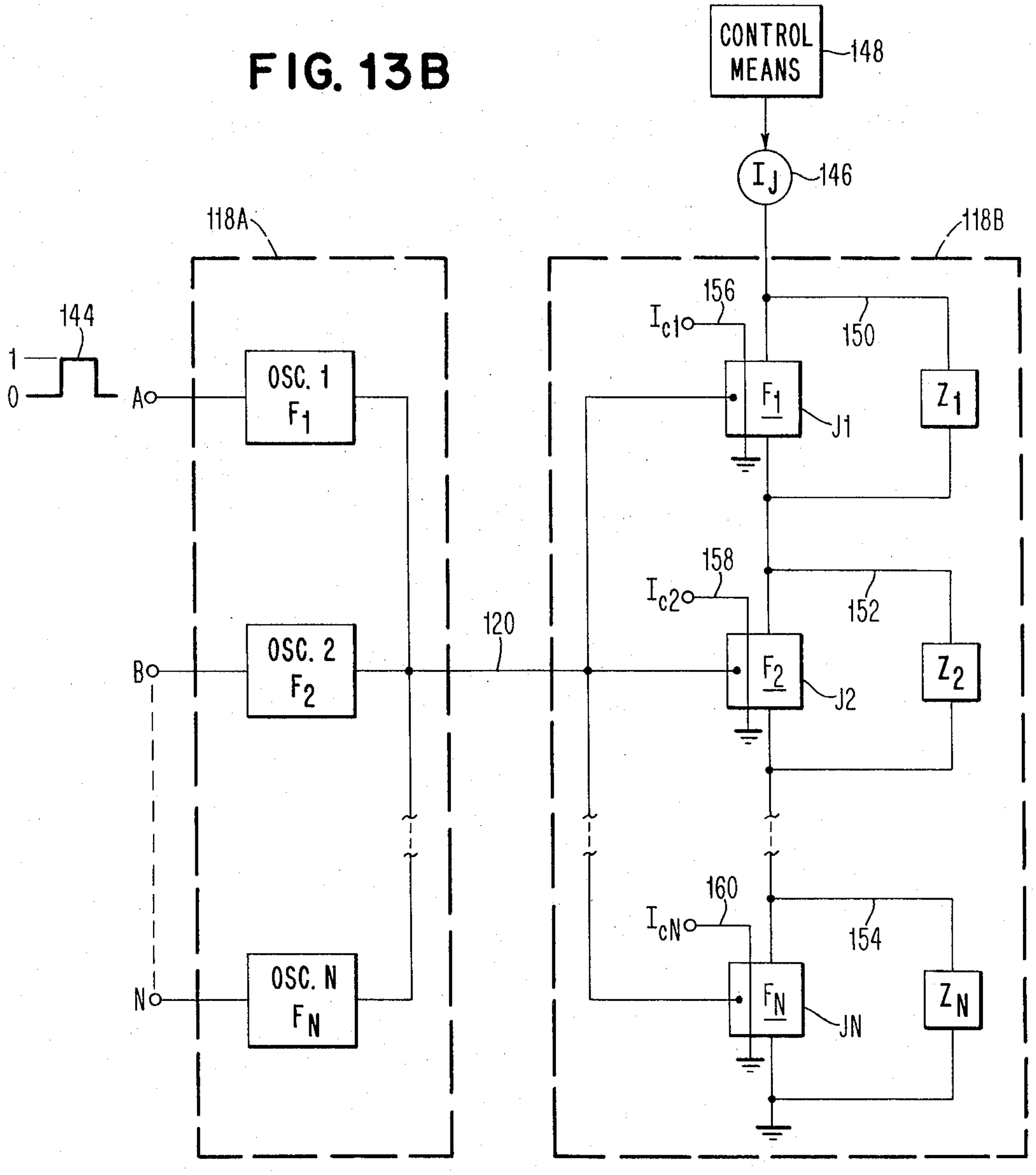
FIG. 13*B* is a circuit using Josephson tunneling devices which provides information transfer between the circuit chips of FIG. 12.

In this figure, apparatus is shown for information transfer between circuit chips 116A and 116B without the necessity of an interconnection wire, as was used in the embodiments of FIGS. 13A and 13B.

Chip 116A has circuitry 162A and 164A thereon. These circuits are comprised of components assembled in the same manner as the sending circuits illustrated in FIGS. 13A and 13B. That is, they are comprised of Josephson tunneling parametrons and oscillators which are connected together in the manner shown in FIGS. 13A and 13B. However, the outputs of circuits 162A and 164A are sent, via conductors 166 and 168, respectively, to conductive elements 170A and 172A.

Located on chip 116B are conductive elements 170B and 172B. Again, these conductive elements are connected to associated circuitry 162B and 164B. Circuits 162B and 164B are comprised of Josephson tunneling parametrons and oscillators which are connected together the same as the receiving circuitry 118B shown in FIGS. 13A and 13B. These receiving circuits are provided for receiving the signals from the conducting plates 170B and 172B.

In operation, conductive plates 170A and 170B are capacitively coupled and transmit information therebetween at a frequency $F_1$. In the same manner, information is transmitted between conductive plates 172A and 172B at a frequency $F_2$. At the frequencies used for Josephson circuitry ($10^{11}$ - $10^{12}$ Hz) capacitive coupling between conductive plates located on separate circuit chips is sufficient to provide communication between the chips without the requirement for interconnecting wires. In addition, the conducting plates can be on either side of each chip. By using the Josephson tunneling parametrons and oscillators in the manner shown in the present embodiment, this type of capacitive interconnection is possible. This has a particular advantage since it is generally very difficult to provide interconnections to various small devices. Use of wireless interconnections means that the individual Josephson tunneling devices and parametrons can be made extremely small.

Figure 14:
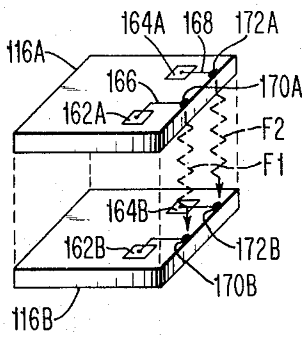
FIG. 14 is a schematic illustration of capacitive coupling for information transfer between circuit chips, where Josephson device circuitry is used for the sending and receiving circuits on the circuit chips.

Thus, the embodiment of FIG. 14 uses capacitive coupling between superconductive chips for transmission of C.W. signals whose phase can be detected with Josephson tunneling parametrons.

SUMMARY

What has been shown is a basic Josephson tunneling parametron and circuitry using Josephson tunneling parametrons and Josephson tunneling oscillators. Any type of Josephson device can be used, although fabrication using planar devices is particularly suitable. Circuitry has been shown for transfer of information from the phase of an ac signal to pulses, and vice versa. In addition, very efficient interconnection schemes for connecting circuitry on the same circuit chip, and on different circuit chips, has been shown.

What is claimed is:

1. A parametron device, comprising:
- an isolated Josephson tunneling device which is electrically unconnected to any source of voltage or current,
- pump means for providing an oscillating magnetic field which intercepts said isolated Josephson tunneling device causing said Josephson tunneling device to parametrically oscillate at a resonant frequency $F_r$.

2. The device of claim 1, where the frequency of said magnetic field is such that the maximum Josephson current $I_m$ in said Josephson tunneling device oscillates at a frequency twice said resonant frequency $F_r$.

3. The device of claim 1, including tuning means for tuning said resonant frequency of said Josephson tunneling device.

4. The device of claim 3, where said tuning means comprises means for producing a magnetic field which intercepts said Josephson tunneling device.

5. The device of claim 4, where said tuning means is comprised of a current carrying line located sufficiently close to said Josephson tunneling device that the magnetic field produced by currents in said line intercepts to said Josephson tunneling device.

6. The device of claim 1, where said Josephson tunneling device is comprised of connected tunnel barriers, said connected tunnel barriers exhibiting Josephson tunneling current therethrough.

7. The device of claim 6, where said tunnel barriers are connected by a superconducting loop, said parametron having an inductance L and exhibiting a maximum Josephson current $I_m$ such that $LI_m < \phi_0$, where $\phi_0$ is a magnetic flux quantum equal to $2 \times 10^{-15}$ volt-second.

8. The device of claim 1, further including additional said Josephson tunneling device parametrons electrically connected to one another, each of which is provided with pump means for producing a magnetic field intercepting each said Josephson tunneling device parametron.

9. The device of claim 1, where said Josephson tunneling device oscillates in one of two stable phases, said Josephson tunneling device having input means electrically connected thereto for applying an electrical signal having one of said phases to said Josephson tunneling device for establishing the phase of oscillation of said Josephson tunneling device.

10. The device of claim 1, where said Josephson tunneling device is a planar device having a Josephson tunneling barrier located between electrically conducting superconductors.

11. An apparatus for converting information represented by electrical pulses to information represented by the phase of a signal, comprising:
- a first Josephson tunneling device having as an input thereto a signal having a first phase,
- first means for providing said electrical pulses for tuning the resonant frequency of said first Josephson tunneling device;
- pump means for providing an oscillating magnetic field which intercepts said Josephson tunneling device, causing said Josephson tunneling device to oscillate with a phase determined by said first phase of said signal.

12. The apparatus of claim 11, including a second Josephson tunneling device having as an input thereto a signal having a second phase, second means for providing said electrical pulses for tuning the resonant frequency of said second Josephson tunneling device, and pump means for providing an oscillating magnetic field which intercepts said second Josephson tunneling device causing said second Josephson tunneling device to oscillate with a phase determined by said second phase of the input to said second Josephson tunneling device.

13. The apparatus of claim 12, including means for coupling the oscillations of said first and second Josephson tunneling devices to a common terminal.

14. The apparatus of claim 11, where said means for tuning the frequency of said first Josephson tunneling device is an electrical conductor located sufficiently close to said first Josephson tunneling device that the magnetic field produced by said electrical pulses in said conductor intercepts said Josephson tunneling device.

15. The apparatus of claim 11, where said pump means is an electrical conductor for carrying an oscillating current for establishing said oscillating magnetic field.

16. The apparatus of claim 11, where said first Josephson tunneling device is comprised of a plurality of tunnel barriers.

17. An apparatus comprising:
- a first circuit chip having thereon susperconducting circuitry for providing information, and a transmitting means for receiving said information from said circuitry where said superconducting circuitry on said first chip includes a Josephson tunneling device parametron capable of oscillating at a first frequency when an oscillating magnetic field is applied thereto, and pump means for providing said oscillating magnetic field, a second circuit chip having thereon receiving superconductive circuitry and a receiving means capacitively coupled to said transmitting means, said receiving means being electrically coupled to said receiving circuitry for coupling information from said first chip to said receiving circuitry.

18. The apparatus of claim 17, where said receiving superconductive circuitry on said second chip includes a Josephson tunneling device parametron which can parametrically oscillate at said first frequency when an oscillating magnetic field is applied thereto, and pump means for providing said oscillating magnetic field to said Josephson tunneling device parametron in said receiving superconductive circuitry.

19. An apparatus comprising:

a first circuit chip having thereon superconducting circuitry for providing information, and a transmitting means for receiving said information from said circuitry where said superconducting circuitry on said first chip includes a Josephson tunneling device oscillator capable of oscillating at a first frequency when triggered into oscillation by a magnetic field, and means for providing said magnetic field for triggering said Josephson tunneling device oscillator into oscillation at said first frequency, a second circuit chip having thereon receiving superconductive circuitry and a receiving means capacitively coupled to said transmitting means, said receiving means being electrically coupled to said receiving circuitry for coupling information from said first chip to said receiving circuitry.

20. The apparatus of claim 19, where said receiving superconductive circuitry on said second chip includes a Josephson tunneling device having a resonant frequency substantially the same as said Josephson tunneling device oscillator on said first chip, and electrical means for providing electrical current through said Josephson tunneling device on said second chip.

21. An apparatus comprising:

a first circuit chip having thereon superconducting circuitry for providing information, and a transmitting means for receiving said information from said circuitry where said superconducting circuitry on said first chip includes a plurality of Josephson tunneling device parametrons capable of oscillating at different frequencies when oscillating magnetic fields are applied thereto, and pump means for providing said oscillating magnetic fields, a second circuit chip having thereon receiving superconductive circuitry and a receiving means capacitively coupled to said transmitting means, said receiving means being electrically coupled to said receiving circuitry for coupling information from said first chip to said receiving circuitry.

22. An apparatus comprising:

a first circuit chip having thereon superconducting circuitry for providing information, and a transmitting means for receiving said information from said circuitry where said superconducting circuitry on said first chip includes a plurality of Josephson tunneling device oscillators capable of oscillating at different frequencies when triggered into oscillation by magnetic fields, and means for providing said magnetic fields for triggering said oscillators into oscillation at said different frequencies, a second circuit chip having thereon receiving superconductive circuitry and a receiving means capacitively coupled to said transmitting means, said receiving means being electrically coupled to said receiving circuitry for coupling information from said first chip to said receiving circuitry.

23. An apparatus comprising, in combination:

at least two circuit chips, each of said chips having thereon at least one Josephson tunneling device parametron which can parametrically oscillate at a first frequency when oscillating magnetic fields are coupled thereto, pump means for producing said oscillating magnetic fields coupled to said parametrons, conductor means connected between said Josephson tunneling device parametrons in said two circuit chips.

24. The apparatus of claim 23, including tuning means for tuning the resonant frequency of said parametrons.

25. The apparatus of claim 24, where said tuning means is comprised of a current carrying conductor adjacent to said parametrons.

26. The apparatus of claim 23, where one of said chips has at least two Josephson tunneling device parametrons thereon, said two parametrons being coupled to input signals having different phases.

27. The apparatus of claim 26, where said two Josephson tunneling device parametrons have conductor means adjacent thereto for carrying electrical currents which produce magnetic fields intercepting said parametrons.

28. The apparatus of claim 23, where at least one of said Josephson tunneling device parametrons is comprised of a plurality of tunnel barriers.

29. The apparatus of claim 23, where said circuit chips have Josephson tunneling devices thereon.

30. An apparatus comprising:

first and second circuit chips, said first circuit chip having thereon at least one Josephson tunneling device oscillator capable of oscillating at a first frequency when triggered into oscillation by a magnetic field, means for providing a magnetic field for triggering said Josephson tunneling device into oscillation at said first frequency, said second circuit chip having thereon at least one Josephson tunneling device having a resonant frequency substantially the same as said Josephson tunneling device oscillator on said first chip, electrical means for providing electrical current through said Josephson tunneling device on said second chip, electrical connecting means for connecting said Josephson tunneling device oscillator on said first circuit chip to said Josephson tunneling device on said second chip.

31. The apparatus of claim 30, including means for tuning the resonant frequency of the Josephson tunneling device on said second circuit chip.

32. The apparatus of claim 30, where said Josephson tunneling device on said second circuit chip has a superconducting line connected thereto for conducting electrical pulses when said Josephson tunneling device in said second circuit chip is switched to a resistive state.

33. The apparatus of claim 30, where said first circuit chip has thereon a plurality of Josephson tunneling device oscillators, and means for providing magnetic fields for triggering the oscillation of said oscillators.

34. The apparatus of claim 33, where said second circuit chip has thereon a plurality of Josephson tunneling devices, which can be tuned to have resonant frequencies substantially the same as that of Josephson tunneling device oscillators in said first circuit chip, and means for tuning the resonant frequency of said Josephson tunneling devices on said second circuit chip.

35. The apparatus of claim 33, wherein said Josephson tunneling device oscillators have different resonant frequencies.

36. The apparatus of claim 30, where said Josephson tunneling devices are planar devices.

37. The apparatus of claim 30, where said first and second circuit chips have Josephson tunneling devices thereon.

38. A parametron device, comprising:

a superconductive tunneling device through which Josephson tunneling current can flow and which is capable of parametric oscillation at a frequency $F_r$ when intercepted by an oscillating magnetic field, pump means providing said oscillating magnetic field for establishing said parametric oscillations.

39. The device of claim 38, where the frequency of saiid oscillating magnetic field is such that the maximum Josephson current in said tunneling device oscillates at a frequency approximately twice said frequency $F_r$.

40. The device of claim 38, including tuning means for tuning the frequency $F_r$ at which said tunneling device oscillates.

41. The device of claim 38, where said Josephson tunneling device is comprised of a plurality of tunnel barriers connected in a superconductive loop.

* * * * *